(12) United States Patent
Isogai et al.

(10) Patent No.: US 11,855,638 B2
(45) Date of Patent: Dec. 26, 2023

(54) OPTICAL LATCH CIRCUIT AND ELECTRONIC DEVICE

(71) Applicants: SEIKO GROUP CORPORATION, Tokyo (JP); ABLIC Inc., Tokyo (JP)

(72) Inventors: Ryosuke Isogai, Tokyo (JP); Yoshifumi Yoshida, Tokyo (JP); Fumiyasu Utsunomiya, Tokyo (JP)

(73) Assignees: Seiko Group Corporation, Toyko (JP); ABLIC INC, Nagano (JP)

( * ) Notice: Subject to any disclaimer, the term of this patent is extended or adjusted under 35 U.S.C. 154(b) by 0 days.

(21) Appl. No.: 17/441,643

(22) PCT Filed: Jan. 22, 2020

(86) PCT No.: PCT/JP2020/002111
§ 371 (c)(1),
(2) Date: Sep. 21, 2021

(87) PCT Pub. No.: WO2020/195064
PCT Pub. Date: Oct. 1, 2020

(65) Prior Publication Data
US 2022/0352877 A1    Nov. 3, 2022

(30) Foreign Application Priority Data

Mar. 26, 2019   (JP) ................................. 2019-057819

(51) Int. Cl.
*H03K 3/42*   (2006.01)
(52) U.S. Cl.
CPC ..................................... *H03K 3/42* (2013.01)

(58) Field of Classification Search
CPC ........................................................ H03K 3/42
See application file for complete search history.

(56) References Cited

U.S. PATENT DOCUMENTS 4,731,640 A * 3/1988 Bluzer ................. H01L 31/112
                                                    257/E31.093
4,964,687 A   10/1990 Falk
(Continued)

FOREIGN PATENT DOCUMENTS

CN   101403772 A   4/2009
CN   104508837 A   4/2015
(Continued)

OTHER PUBLICATIONS

Various, "Photodiode", accessed 2018, Wikipedia, all pages (Year: 2018).*

(Continued)

*Primary Examiner* — Daniel C Puentes
(74) *Attorney, Agent, or Firm* — Crowell & Moring LLP

(57) ABSTRACT

According to the present invention, an optical latch circuit includes a voltage detector configured to compare a first power generation voltage input from a first input terminal with a preset first threshold voltage and output a set signal from a determination output terminal when the first power generation voltage exceeds the first threshold voltage, a first photovoltaic element connected between the first input terminal and a grounding point in a forward direction and configured to output a first power generation voltage to the first input terminal according to photovoltaic power when light is radiated, and a feedback resistor inserted between the first input terminal and the determination output terminal.

20 Claims, 6 Drawing Sheets

(56) References Cited

U.S. PATENT DOCUMENTS

| | | | |
|---|---|---|---|
| 5,281,805 A | 1/1994 | Sauer | |
| 5,404,373 A | 4/1995 | Cheng | |
| 6,841,771 B2* | 1/2005 | Shimizu | H04B 10/66 |
| | | | 250/214 AG |
| 2004/0033457 A1* | 2/2004 | Zhang | F23N 5/082 |
| | | | 431/79 |
| 2010/0232808 A1 | 9/2010 | Nagai | |
| 2011/0234302 A1 | 9/2011 | Utsunomiya et al. | |
| 2017/0005508 A1* | 1/2017 | Utsunomiya | G06F 3/0383 |

FOREIGN PATENT DOCUMENTS

| | | |
|---|---|---|
| JP | S58-219823 A | 12/1983 |
| JP | S63-036612 A | 2/1988 |
| JP | H07-038504 A | 2/1995 |
| JP | 2010-219642 A | 9/2010 |
| WO | WO 2016/167818 A1 | 10/2016 |

OTHER PUBLICATIONS

Undisclosed author, "Difference between Photovoltaic and Photo-conductive mode photodiode", accessed May 5, 2019, RF Wireless World, all pages (Year: 2019).*

Wang Lina, "China Master's Theses Full-text Database" Research on All-optical Trigger Based on Semiconductor Ogtical Amglifier, 2018.

Office Action in China Application No. 2020800230238, dated Apr. 14, 2022, _pages.

Search Report in Europe Application No. 207771049, dated Mar. 21, 2022, 7 pages.

International Search Report and Written Opinion, in Application No. PCT/JP2020/002111, dated Apr. 14, 2020, 8 pages.

* cited by examiner

US 11,855,638 B2

OPTICAL LATCH CIRCUIT AND ELECTRONIC DEVICE

RELATED APPLICATIONS

This application is a 371 application of PCT/JP2020/002111 having an international filing date of Jan. 22, 2020, which claims priority to JP2019-057819 filed Mar. 26, 2019, the entire content of each of which is incorporated herein by reference.

TECHNICAL FIELD

The present invention relates to an optical latch circuit and an electronic device.

BACKGROUND ART

Conventionally, there are electronic devices in which a battery is directly mounted on a substrate or a battery is inserted in advance, thus saving time and effort required for a user to insert a battery.

In the case of the above-described electronic device, electric power stored in the battery is consumed according to discharging (standby power). The electronic device may not operate when the user tries to activate the electronic device.

Thus, it is necessary to reduce standby power consumption in electronic devices to the utmost limit and reduce power consumption for periods such as a stock period and a non-operation period.

As a countermeasure, generally, a space between an electrode of a battery and an electrode of the electronic device is blocked by an insulator, so that an electric current is prevented from flowing between the battery and the electronic device and the consumption of standby power is limited.

When the electronic device is activated, a method of removing the insulator between the electrode of the battery and the electrode of the electronic device and allowing an electric current to flow between the battery and the electronic device is used.

Also, a configuration in which a contact switch is used to establish a connection between the electrode of the battery and the electrode of the electronic device when the electronic device is activated may be adopted.

When a contact switch is used, the contacts may deteriorate and the electronic device may not be activated when the electronic device in stock for a long period of time is activated.

Furthermore, in the case of an electronic device that needs to be sealed with a resin or the like, an insulator cannot be inserted between the electrode of the battery and the electrode of the electronic device.

Also, a movable part for switching is required and a structure for sealing the movable part becomes complicated. As the movable part operates, the movable part deteriorates and the sealing performance of a sealing material deteriorates.

Thus, a configuration in which an optical latch circuit is used to perform switching for supplying electric power from a battery to an electronic device by performing inversion in the optical latch circuit when light is radiated to the optical latch circuit is adopted (for example, see Patent Literature 1).

In this case, a transparent resin is used as the sealing material so that the light reaches the optical latch circuit.

CITATION LIST

Patent Literature

Patent Literature 1: Japanese Unexamined Patent Application, First Publication No. 2010-219642

SUMMARY OF INVENTION

Technical Problem

The above-described Patent Literature 1 includes an optical detection unit (to be described below), a latch circuit control unit 104, and a set/reset (SR) latch circuit 105.

As shown in FIG. 9, the optical detection unit includes photodiodes 101 and 102 and a voltage detector 103.

When the photodiode 101 is irradiated with light, the latch circuit control unit 104 sets the SR latch 105 and sets the level of an output signal OVID to, for example, an "H" level. Also, when the photodiode 102 is irradiated with light, the latch circuit control unit 104 resets the SR latch 105 and sets the level of the output signal OUTD to, for example, an "L" level.

However, in Patent Literature 1, as shown in FIG. 9, each of the photodiodes 101 and 102 is connected to the battery so as to have a reverse bias.

According to the above configuration, when the photodiode 101 (or 102) is irradiated with light, a photocurrent corresponding to an amount of radiated light flows from the battery through the photodiode 101 (or 102), so that the power consumption of the battery will be faster.

That is, even if an intensity of radiated light is an intensity at which the SR latch 105 is not set/reset, the battery power is consumed by the photocurrent corresponding to the amount of light. Thus, even during a stock period or a non-operation period, the above-described photocurrent flows, so that the electric current consumption cannot be sufficiently reduced and it is difficult to limit the power consumption of the battery and extend the lifespan of the battery.

Although a case may be conceived in which light is blocked from a transparent resin so that the photodiodes 101 and 102 are not irradiated with light during the non-operation period and preventing the above-described photocurrent to flow, an instrument such as a light-shielding material is required to block the light.

Also, when the electronic device is not activated during the non-operation period, the above-described instrument is attached to the electronic device. On the other hand, when the electronic device is activated, work such as removing the instrument is required, which makes handling troublesome.

The present invention has been made in view of such circumstances and an objective of the present invention is to provide an optical latch circuit and an electronic device capable of detecting whether or not light has been radiated without allowing a photocurrent serving as a consumption current to flow from a battery even if light is radiated and enabling a light-receiving element to be easily handled since it is not necessary to store the light-receiving element in a state in which the light-receiving element is blocked even during a stock period or a non-operation/malfunction period.

Solution to Problem

According to the present invention, an optical latch circuit is provided, including: a voltage detector (for example, a voltage detector 11) configured to compare a first power generation voltage (for example, a power generation voltage VI1) input from a first input terminal (for example, an input terminal INPUT1) with a preset first threshold voltage (for example, a threshold voltage VTH1) and output a set signal from a determination output terminal (for example, a determination output terminal OUTPUT) when the first power generation voltage exceeds the first threshold voltage; a first photovoltaic element (for example, a photovoltaic element 12) connected between the first input terminal and a grounding point in a forward direction and configured to output a first power generation voltage to the first input terminal according to photovoltaic power when light is radiated; and a feedback resistor (for example, a feedback resistor 13) inserted between the first input terminal and the determination output terminal.

According to the present invention, an electronic device is provided, including: the above-described optical latch circuit; and a drive target circuit (for example, a drive target circuit 200) configured to perform a predetermined process, wherein driving of the drive target circuit starts when the set signal is supplied from the determination output terminal in the optical latch circuit.

Advantageous Effects of Invention

According to the present invention, it is possible to provide an optical latch circuit and an electronic device capable of detecting whether or not light has been radiated without allowing a photocurrent serving as a consumption current to flow from a battery even if light is radiated and enabling a light-receiving element to be easily handled since it is not necessary to store the light-receiving element in a state in which the light-receiving element is blocked even during a stock period or a non-operation/malfunction period.

DESCRIPTION OF EMBODIMENTS

First Embodiment

Figure 1:
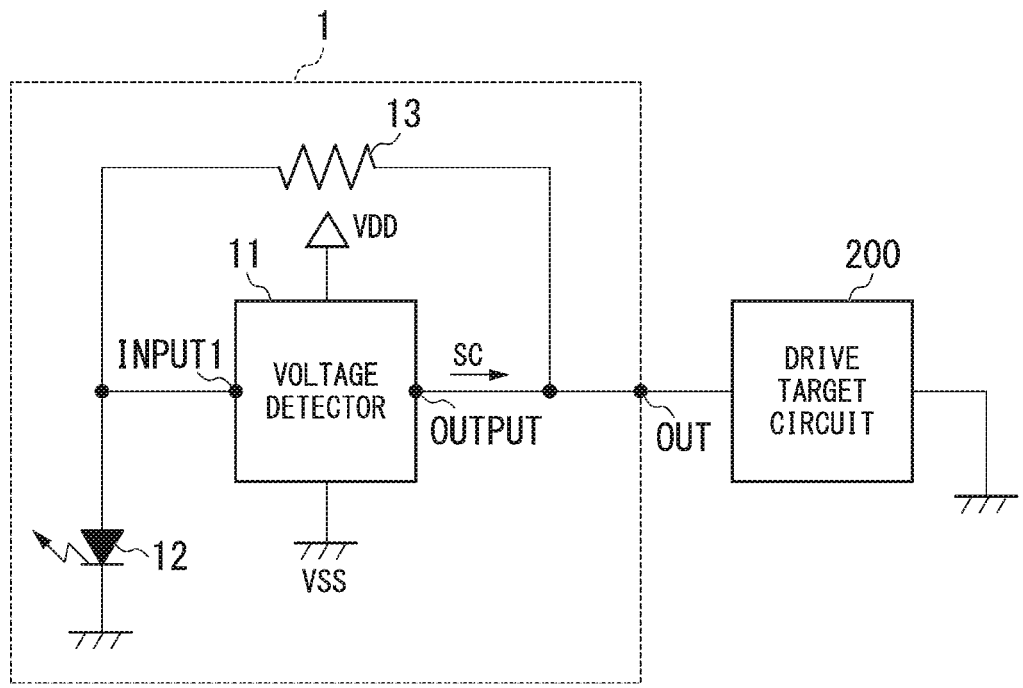
FIG. 1 is a schematic block diagram showing an example of a configuration of an optical latch circuit in an electronic device according to a first embodiment of the present invention.

Hereinafter, a first embodiment of the present invention will be described with reference to the drawings. FIG. 1 is a schematic block diagram showing an example of a configuration of an optical latch circuit in an electronic device according to the first embodiment of the present invention.

In FIG. 1, an optical latch circuit 1 includes a voltage detector 11, a photovoltaic element 12, and a feedback resistor 13. A drive target circuit 200 is driven or stopped according to a drive control signal supplied from an output terminal OUT of the optical latch circuit 1. Each of driving and stopping is controlled according to, for example, whether or not electric power is supplied. In the present embodiment, for example, the drive target circuit 200 is driven when a signal level of the drive control signal is an "H" level, and is stopped when the signal level of the drive control signal is an "L" level.

The voltage detector 11 compares a power generation voltage VI1 (to be described below) applied to an input terminal INPUT1 with a preset threshold voltage VTH1 and causes a drive control signal SC output from the determination output terminal OUTPUT to transition from the "L" level to the "H" level when the power generation voltage VI1 exceeds the threshold voltage VTH1 (the set signal is output).

The photovoltaic element 12 is, for example, a light-emitting diode (gallium arsenide (GaAs) (a so-called gallium arsenide series or the like) and has an anode connected to the input terminal INPUT1 and a cathode connected to a grounding point. That is, the photovoltaic element 12 is connected to the grounding point in the forward direction between the input terminal INPUT1 and the grounding point. Also, the photovoltaic element 12 outputs a power generation voltage VI1 having a voltage level corresponding to the intensity of the radiated light to the input terminal INPUT1 according to photovoltaic power when the light is radiated.

The photovoltaic element 12 may be a photodiode or a solar cell instead of the light-emitting diode described above. However, because the voltage output according to the photovoltaic power is highest in a light-emitting diode and the cost thereof is low, it is desirable to use a light-emitting diode.

The feedback resistor 13 has one end connected to the determination output terminal OUTPUT and the other end connected to the input terminal INPUT1.

Figure 2:
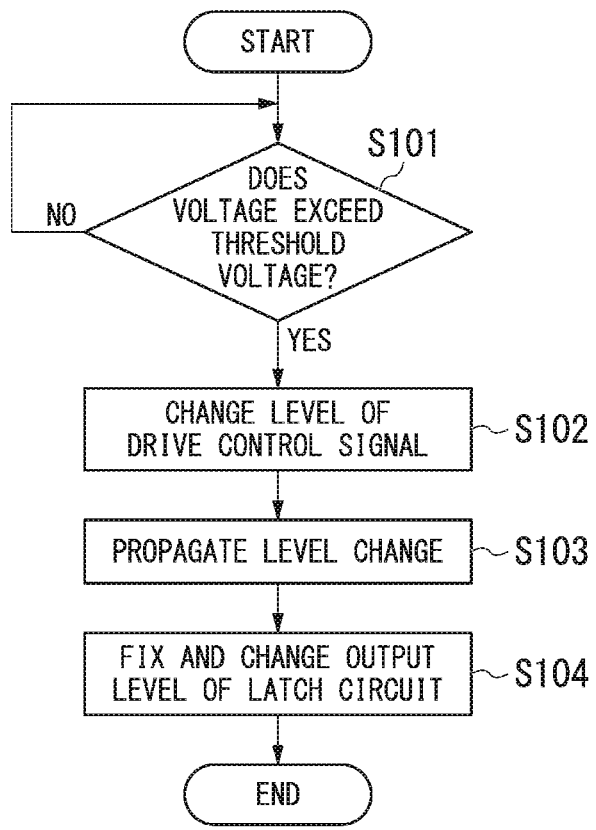
FIG. 2 is a flowchart showing an example of an operation of a latch process of an optical latch circuit 1 according to the first embodiment of the present invention.

An operation of the optical latch circuit 1 will be described below. FIG. 2 is a flowchart showing an example of an operation of a latch process of the optical latch circuit 1 according to the first embodiment of the present invention. In an initial state, the optical latch circuit 1 outputs a drive control signal SC of the "L" level from the determination output terminal OUTPUT.

Step S101: The optical latch circuit 1 determines whether or not the power generation voltage VI1 applied to the input terminal INPUT1 exceeds the threshold voltage VTH.

At this time, when the photovoltaic element 12 is irradiated with light exceeding a predetermined light intensity, the power generation voltage VI1 supplied to the input terminal INPUT1 by the photovoltaic element 12 exceeds the threshold voltage VTH.

Thereby, the optical latch circuit 1 proceeds to step S102 because the power generation voltage VI1 exceeds the threshold voltage VTH1.

On the other hand, when the photovoltaic element 12 is not irradiated with light exceeding a predetermined light intensity, the power generation voltage VI1 supplied to the input terminal INPUT1 by the photovoltaic element 12 is lower than or equal to the threshold voltage VTH1.

Thereby, the voltage detector 11 iterates the processing of step S101 because the power generation voltage VI1 does not exceed the threshold voltage VTH.

Step S102: The voltage detector 11 causes the drive control signal SC output from the determination output terminal OUTPUT to be changed from the "L" level (a voltage of a power supply VSS) to the "H" level (a voltage of a power supply VDD).

Step S103: Because the voltage detector 11 causes the voltage level of the drive control signal SC to be changed from the "L" level to the "H" level, the above-described change in the voltage level is propagated to the input terminal INPUT1 of the voltage detector 11 via the feedback resistor 13.

Step S104: Because the voltage of the drive control signal SC is at the "H" level, a voltage exceeding the threshold voltage TTH1 is supplied to the input terminal INPUT1.

Thus, even if the photovoltaic element 12 is not irradiated with light exceeding the predetermined light intensity, the voltage detector 11 retains (latches) the drive control signal SC output from the determination output terminal OUTPUT at the "H" level.

Thereby, the optical latch circuit 1 supplies the drive control signal SC retained at the "H" level from the output terminal OUT to the drive target circuit 200 and causes the drive target circuit 200 to be continuously driven.

According to the present embodiment, because a light intensity is detected and it is determined whether or not the light intensity has reached the predetermined light intensity using the power generation voltage VI1 generated by the photovoltaic element 12 according to the photovoltaic power in correspondence with the light intensity, the electronic device can significantly increase the lifespan of the battery without allowing a consumption current to flow from the battery as in the prior art unless light of the predetermined light intensity is radiated during a stock period or a non-operation period (including a period in which delivery is in progress).

That is, unless light of the predetermined light intensity is radiated, only the generated power generated by the photovoltaic element 12 is consumed and the operation of changing the voltage level of the drive control signal SC output by the voltage detector 11 is not performed, so that the power of the battery is not consumed.

Figure 3:
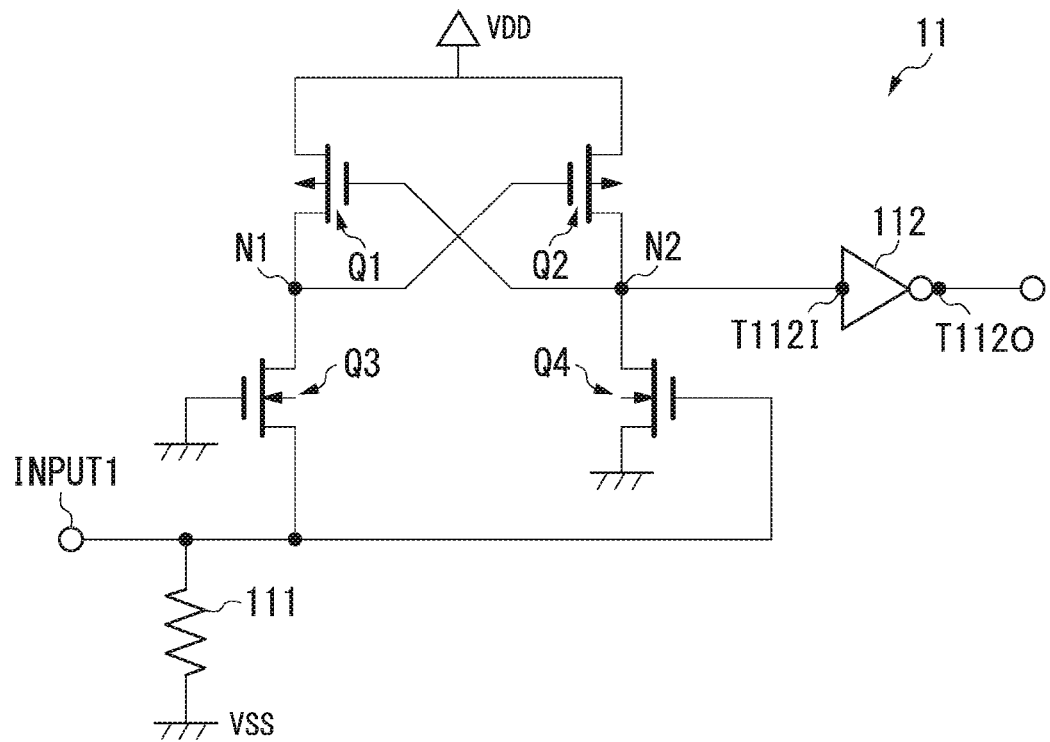
FIG. 3 is a circuit diagram showing an example of a configuration of a voltage detector 11 according to the first embodiment of the present invention.

FIG. 3 is a circuit diagram showing an example of a configuration of the voltage detector 11 according to the first embodiment of the present invention. In FIG. 3, the voltage detector 11 includes metal-oxide-semiconductor (MOS) transistors Q1, Q2, Q3, and Q4, a lead resistor 111, and an inverter 112.

The MOS transistors Q1 and Q2 are enhancement-type P-channel MOS transistors.

Also, the MOS transistor Q3 is a depletion-type N-channel MOS transistor. The MOS transistor Q4 is an enhancement-type N-channel MOS transistor.

The inverter 112 is a NOT gate circuit including, for example, a MOS transistor.

The MOS transistor Q1 has a source connected to the power supply VDD, a gate connected to a drain of the MOS transistor Q2, a drain of the MOS transistor Q4, and an input terminal T112I of the inverter 112, and a drain connected to a drain of the MOS transistor Q3 and a gate of the MOS transistor Q2.

The MOS transistor Q2 has a source connected to the power supply VDD, a gate connected to the drain of the MOS transistor Q1 and the drain of the MOS transistor Q3, and a drain connected to the gate of the MOS transistor Q1, the drain of the MOS transistor Q4, and the input terminal T112I of the inverter 112.

The MOS transistor Q3 has a drain connected to the drain of the MOS transistor Q1 and the gate of the MOS transistor Q2, a gate connected to the power supply VSS (the grounding point), and a source connected to the input terminal INPUT1.

The MOS transistor Q4 has the drain connected to the gate of the MOS transistor Q1, the drain of the MOS transistor Q2, and the input terminal T112I of the inverter 112.

The lead resistor 111 has one end connected to the input terminal T112I, and the other end connected to the power supply VSS (the grounding point).

The inverter 112 has the input terminal T112I connected to the gate of the MOS transistor Q1, the drain of the MOS transistor Q2, and the drain of the MOS transistor Q4.

Hereinafter, an operation in which the voltage detector 11 shown in FIG. 3 performs voltage detection with respect to the power generation voltage VI1 applied to the input terminal INPUT1 will be described. The light intensity at which the drive target circuit 200 is started to be driven is preset in the design. Thus, the power generation voltage VI1 output by the photovoltaic element 12 when light is radiated at the light intensity at which the start of the driving is desired is measured in advance.

Transistor sizes and threshold voltages of the MOS transistors Q1, Q2, Q3, and Q4 are set so that a voltage identical with the measured power generation voltage VI1 (or a voltage with a certain margin) is the threshold voltage VTH1 for the optical latch circuit 1 to change the drive control signal SC from the "L" level to the "H" level.

The intensity of the radiated to the photovoltaic element 12 increases and hence the power generation voltage VI1 supplied to the input terminal INPUT1 also increases.

Thereby, the voltage of the source of the MOS transistor Q3 increases and a drain current ID3 flowing through the MOS transistor Q3 decreases.

Also, the voltage at the gate of the MOS transistor Q4 increases and hence a drain current ID4 starts to flow through the MOS transistor Q4.

When the intensity of the light radiated to the photovoltaic element 12 exceeds the preset intensity, the power generation voltage VI1 exceeds the threshold voltage VTH1.

At this time, because a current value of the drain current ID4 flowing through the MOS transistor Q4 is larger than a drain current ID2 flowing through the MOS transistor Q2, a voltage at a connection point N2 becomes the "L" level.

Thereby, the inverter 112 outputs an "H" level voltage from the output terminal T112O because an "L" level voltage is applied to the input terminal T112I (an "H" level output of the drive control signal SC).

Also, the MOS transistor Q3 is turned off because the power generation voltage VI1 applied to its source exceeds the threshold voltage.

Thereby, because the "L" level is applied to the gate of the MOS transistor Q4, the MOS transistor Q1 is turned on and the connection point N1 has the "H" level.

The MOS transistor Q2 is turned off because an "H" level voltage is applied to its gate.

When the intensity of the light radiated to the photovoltaic element 12 exceeds the preset intensity according to the above-described processing, the voltage at the connection point N1 changes from the "L" level to the "H" level and the voltage at the connection point N2 changes from the "H" level to the "L" level (a SET operation of the optical latch circuit 1).

Therefore, the threshold voltage VTH1 is set in correspondence with the power generation voltage VI1 supplied from the input terminal INPUT1 according to the threshold voltage and the drain current ID2 of the MOS transistor Q2 and the threshold voltage and the drain current ID4 of the MOS transistor Q4.

As described above, the voltage detector 11 according to the present embodiment is configured to detect whether or not the intensity of the light radiated to the photovoltaic element 12 has reached a preset intensity and applies the power generation voltage VI1 to the source of the depletion-type MOS transistor Q3. Thereby, for example, when the power generation voltage VI1 when the intensity of the light radiated to the photovoltaic element 12 exceeds the preset intensity is "0.4 V," the threshold voltage of the MOS transistor Q3 is set to "−0.3 V," and the threshold voltage of the MOS transistor Q4 is set to "0.4 V." In this case, because the MOS transistor Q4 is not turned on before the power generation voltage VI1 rises to "0.4 V," basically no consumption current flows from the power supply VDD (i.e., the battery). Also, at this time, because the MOS transistor Q1 is turned off, no consumption current is flowing through the MOS transistor Q3.

Second Embodiment

Figure 4:
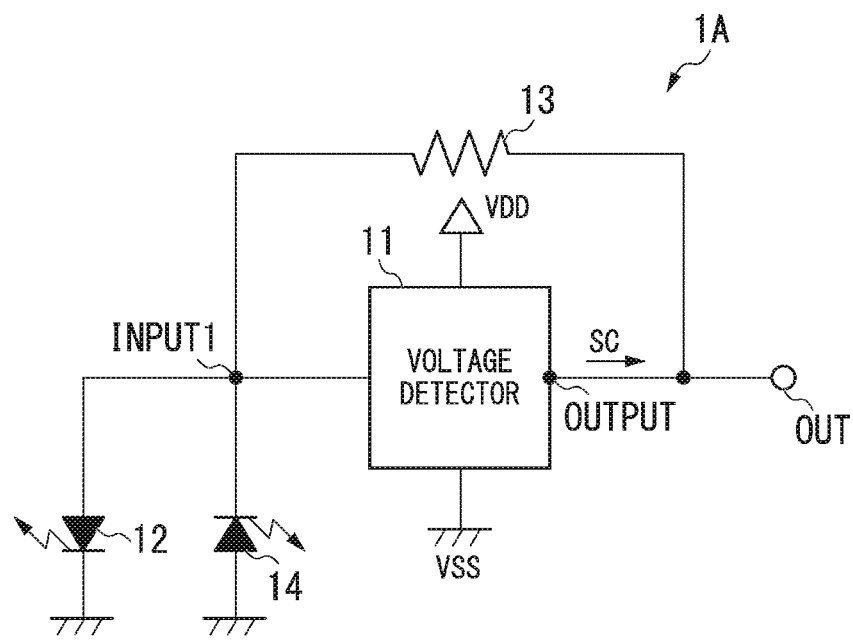
FIG. 4 is a schematic block diagram showing an example of a configuration of an optical latch circuit according to a second embodiment of the present invention.

Hereinafter, a second embodiment of the present invention will be described with reference to the drawings. FIG. 4 is a schematic block diagram showing an example of a configuration of an optical latch circuit according to the second embodiment of the present invention.

In FIG. 4, an optical latch circuit 1A includes a voltage detector 11, photovoltaic elements 12 and 14, and a feedback resistor 13. In the present embodiment, as in the electronic device of FIG. 1, for example, a drive target circuit 200 is driven when a signal level of a drive control signal SC is an "H" level and is stopped when the signal level of the drive control signal SC is an "L" level.

The configuration in which the optical latch circuit 1A shown in FIG. 4 is different from the optical latch circuit 1 of the first embodiment is that a photovoltaic element 14 is newly added.

The photovoltaic element 14 has features similar to those of the photovoltaic element 12 described in the first embodiment and generates a power generation voltage VI2 according to photovoltaic power corresponding to a light intensity of radiated light.

Because the power generation voltage VI2 output in correspondence with the light intensity has the same absolute value as the power generation voltage VI1 in the first embodiment, but is provided in a reverse direction between an input terminal INPUT1 and a grounding point, the polarity of the voltage is reversed.

For example, if the power generation voltage VI1 when the intensity of the light radiated to the photovoltaic element 12 exceeds the preset intensity is "0.4 V," the photovoltaic element 14 outputs a power generation voltage VI2 of "−−0.4 V" when light of a similar light intensity is radiated.

Also, the optical latch circuit 11A compares the power generation voltage VI2 supplied to the input terminal INPUT1 with a threshold voltage VTH2.

When the power generation voltage VI2 is less than the threshold voltage VTH2 (i.e., −0/4 V), the optical latch circuit 11A causes the voltage level of the drive control signal SC to be changed from the "H" level to the "L" level.

The threshold voltage VTH2 is set in correspondence with the power generation voltage VI2 when the intensity of the light radiated to the photovoltaic element 14 exceeds a preset intensity.

As described above, the optical latch circuit 1 of the first embodiment operates in only one direction to change the drive control signal SC from the "L" level to the "H" level.

However, in the embodiment, the optical latch circuit 1A can make a bi-directional change in which the drive control signal SC is changed (set) from the "L" level to the "H" level and is changed (reset) from the "H" level to the "L" level.

Thereby, according to the present embodiment, the drive control signal SC can be switched between the "L" level and the "H" level and the drive target circuit 200 of FIG. 1 can be driven or stopped.

Also, according to the present embodiment, as in the first embodiment, because a light intensity is detected and it is determined whether or not the light intensity has reached a predetermined light intensity using the power generation voltage VI1 or VI2 generated by the photovoltaic element 12 or 14 according to the photovoltaic power in correspondence with the light intensity, the electronic device can significantly increase the lifespan of the battery without allowing a consumption current to flow from the battery as in the prior art unless light of a predetermined light intensity is radiated during a stock period or a non-operation period (including a period in which delivery is in progress).

In the case of the present embodiment, the optical latch circuit 1A is set by the power generation voltage VI1 when the photovoltaic element 12 is irradiated with light of a predetermined intensity and is set by the power generation voltage VI2 when the photovoltaic element 14 is irradiated with light of the predetermined intensity.

Therefore, if both the photovoltaic elements 12 and 14 are simultaneously irradiated with light of the predetermined intensity, there is a possibility of malfunction.

Thus, in the electronic device, a position where the photovoltaic element 12 is disposed and a position where the photovoltaic element 14 is disposed are provided apart from each other so that both the photovoltaic elements 12 and 14 are not irradiated with light at the same time.

Under a light environment of an ordinary indoor fluorescent lamp and a light-emitting diode (LED) light, the power generation voltage VI1 of the photovoltaic element 12 does not exceed a threshold voltage VTH1 and the power generation voltage VI2 of the photovoltaic element 14 is not less than the threshold voltage VTH2.

In the case of the present embodiment, for example, a light irradiation device for radiating light to a spot in a predetermined range is used to radiate light having an intensity of light radiated only to either one of the photovoltaic elements 12 and 14 provided apart from each other exceeding a preset intensity.

Also, a configuration in which the photovoltaic elements 12 and 14 are masked by light-shielding materials and one of the light-shielding materials is removed to irradiate one of the photovoltaic elements 12 and 14 with light may be adopted.

An operation in which the level of the drive control signal SC is changed to the "L" level when the photovoltaic element 14 is irradiated with light of a predetermined intensity in a state in which the drive control signal SC from the voltage detector 11 is output at the "H" level will be described with reference to FIGS. 3 and 4. At this time, the photovoltaic element 12 is not irradiated with light of the predetermined intensity.

Thus, the power generation voltage VI2 is applied to the input terminal INPUT1, of the voltage detector 11.

An "H" level voltage is applied to the input terminal INPUT1, via the feedback resistor 13.

Thus, when the power generation voltage VI2 generated by the photovoltaic element 14 is lowered by irradiating the photovoltaic element 14 with light, the power generation voltage VI2 applied to the input terminal INPUT1 of the voltage detector 11 becomes less than the threshold voltage VTH2 if the electric current flowing through the photovoltaic element 14 is greater than the electric current flowing through the feedback resistor 13.

When the power generation voltage VI2 is less than the threshold voltage VTH2, a MOS transistor Q4 is turned off and a MOS transistor Q3 is turned on.

A drain current ID1 flowing through a MOS transistor Q1 becomes greater than a drain current ID3 flowing through the MOS transistor Q3, a MOS transistor Q2 is turned on, and the MOS transistor Q1 is turned off.

As a result, the level of a connection point N1 changes from the "H" level to the "L" level and the level of a connection point N2 changes from the "L" level to the "H" level.

Thereby, the inverter 112 outputs an "L" level voltage from the output terminal T112O because an "H" level voltage is applied to the input terminal T112A (an "L" level output of the drive control signal SC).

According to the above-described processing, when the intensity of the light radiated to the photovoltaic element 14 exceeds the preset intensity, the voltage at the connection point N1 changes from the "H" level to the "L" level and the voltage of the connection point N2 changes from the "L" level to the "H" level.

Therefore, the threshold voltage VTH2 is set in correspondence with the power generation voltage VI2 supplied from the input terminal INPUT1 according to a threshold voltage and a drain current ID1 of the MOS transistor Q1, a threshold voltage and a drain current ID3 of the MOS transistor Q3, and a resistance value of the feedback resistor 13 (for example, a resistance value in a predetermined range centered on 10 MΩ).

Third Embodiment

Figure 5:
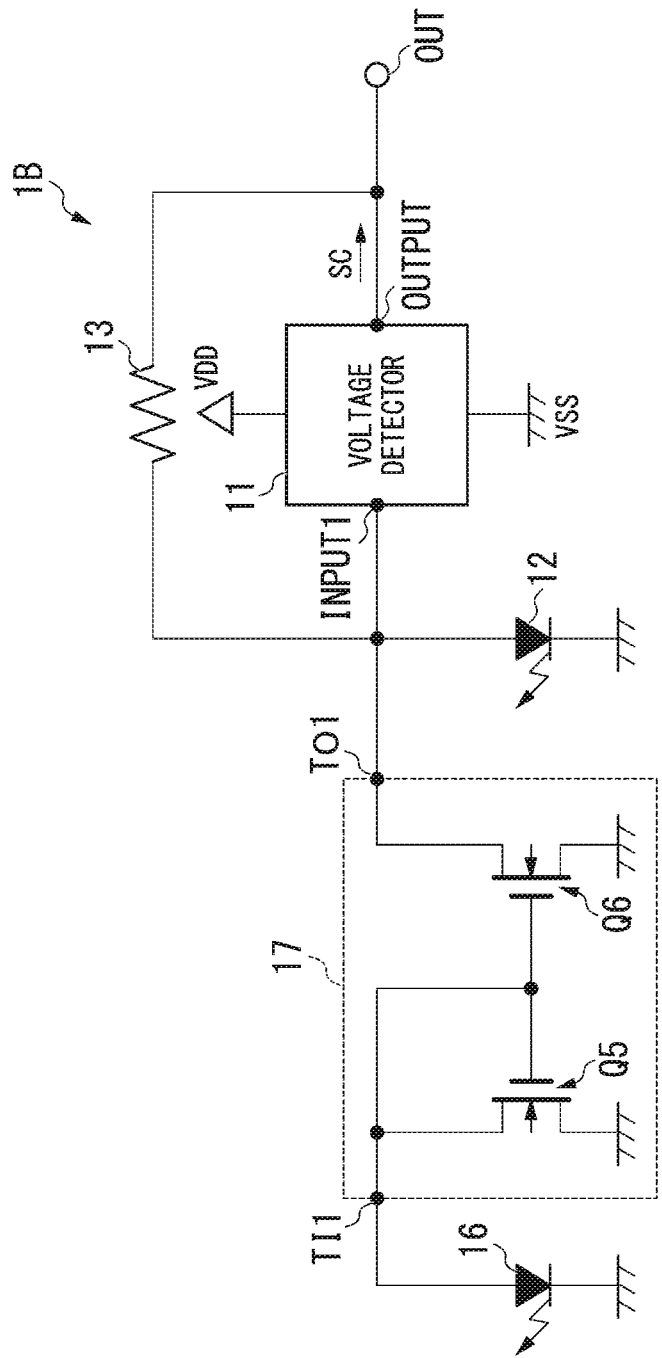
FIG. 5 is a schematic block diagram showing an example of a configuration of an optical latch circuit according to a third embodiment of the present invention.

Hereinafter, a third embodiment of the present invention will be described with reference to the drawings. FIG. 5 is a schematic block diagram showing an example of a configuration of an optical latch circuit according to the third embodiment of the present invention.

In FIG. 5, an optical latch circuit 1B includes a voltage detector 11, photovoltaic elements 12 and 16, a current mirror circuit 17, and a feedback resistor 13. In the present embodiment, as in the electronic device of FIG. 1, for example, a drive target circuit 200 is driven when a signal level of a drive control signal SC is an "H" level and is stopped when the signal level of the drive control signal SC is an "L" level.

The configuration in which the optical latch circuit 1B shown in FIG. 5 is different from the optical latch circuit 1 of the first embodiment is that the photovoltaic element 16 and the current mirror circuit 17 including MOS transistors Q5 and Q6 are newly added. The MOS transistors Q5 and Q6 are enhancement-type N-channel MOS transistors.

The photovoltaic element 16 has features similar to those of the photovoltaic element 12 described in the first embodiment and generates a power generation voltage VI4 according to photovoltaic power corresponding to a light intensity of radiated light.

Because the power generation voltage VI4 output in correspondence with the light intensity is provided in a forward direction between an input terminal INPUT2 and a grounding point, the power generation voltage VI4 having the same polarity and the same voltage level as the power generation voltage VI1 is generated.

The photovoltaic element 16 has an anode connected to a current input terminal TI1 of the current mirror circuit 17 and a cathode connected to the grounding point.

The MOS transistor Q5 has a drain and a gate connected to the current input terminal TI1 and the gate of the MOS transistor Q6 and a source connected to the grounding point.

The MOS transistor Q6 has a drain connected to a current output terminal TO1, a gate connected to the drain and the gate of the MOS transistor Q5, and a source connected to the grounding point.

The current mirror circuit 17 has the current output terminal TO1 connected to an input terminal INPUT1, of the voltage detector 11.

When the photovoltaic element 16 is irradiated with light of a predetermined intensity in a state in which the drive control signal SC is output from the voltage detector 11 at the "H" level, an operation in which the level of the drive control signal SC changes to the "L" level will be described with reference to FIGS. 3 and 5. At this time, the photovoltaic element 12 is not irradiated with light of a predetermined intensity.

Therefore, the power generation voltage VI4 is applied to the input terminal INPUT1 of the voltage detector 11.

An "H" level voltage is applied to the input terminal INPUT1 via the feedback resistor 13.

Here, when the photovoltaic element 16 is irradiated with light, the photovoltaic voltage VI4 generated by the photovoltaic element 14 increases and an electric current corresponding to the power generation voltage VI4 is allowed to flow through the MOS transistor Q5. Thereby, an electric current obtained by multiplying an electric current flowing through the MOS transistor Q5 by a ratio between transistor sizes of the MOS transistors Q5 and Q6 flows through the MOS transistor Q6 in correspondence with the ratio between the transistor sizes.

Therefore, even if the electric current flowing through the MOS transistor Q5 is smaller than a feedback current If flowing through the feedback resistor 13, the transistor size of the MOS transistor Q6 is made larger than that of the MOS transistor Q5, so that the level of the input terminal INPUT1 is lowered to the "L" level.

Thereby, as described in the second embodiment, the input terminal INPUT1 has the "L" level, the MOS transistor Q4 is turned off, and the MOS transistor Q3 is turned on. Thus, when a power generation voltage VI2 becomes less than the threshold voltage VTH2, the MOS transistor Q4 is turned off and the MOS transistor Q3 is turned on.

A drain current ID1 flowing through the MOS transistor Q1 becomes larger than a drain current ID3 flowing through the MOS transistor Q3, the MOS transistor Q2 is turned on and the MOS transistor Q1 is turned off.

As a result, the level of the connection point N1 changes from the "H" level to the "L" level and the level of the connection point N2 changes from the "L" level to the "H" level.

Thereby, the inverter 112 outputs an "L" level voltage from an output terminal T112O because an "H" level voltage is applied to an input terminal T112I (an "L" level output of the drive control signal SC).

According to the above-described processing, when the intensity of the light radiated to the photovoltaic element 16 exceeds the preset intensity, the voltage at the connection point N1 changes from the "H" level to the "L" level and the voltage at the connection point N2 changes from the "L" level to the "H".

Therefore, the threshold voltage VTH2 is set in correspondence with the power generation voltage VI2 supplied from the input terminal INPUT1 according to the threshold voltage and the drain current ID1 of the MOS transistor Q1, the threshold voltage and the drain current ID3 of the MOS transistor Q3, and the resistance value of the feedback resistor 13 (for example, a resistance value in a predetermined range centered on 10 MΩ).

According to the present embodiment, the drive control signal SC can be switched between the "L" level and the "H" level and the drive target circuit 200 of FIG. 1 can be driven or stopped.

Fourth Embodiment

Figure 6:
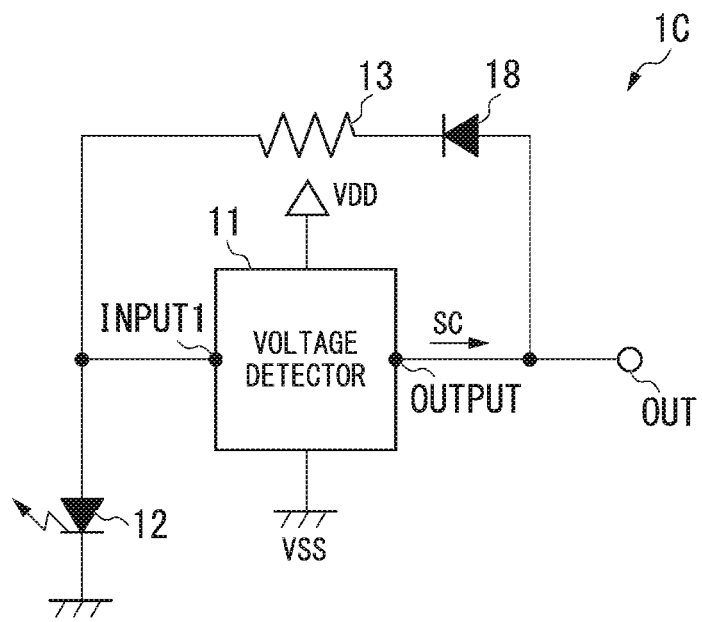
FIG. 6 is a schematic block diagram showing an example of a configuration of an optical latch circuit according to a fourth embodiment of the present invention.

Hereinafter, a fourth embodiment of the present invention will be described with reference to the drawings. FIG. 6 is a schematic block diagram showing an example of a configuration of an optical latch circuit according to the fourth embodiment of the present invention.

In FIG. 6, an optical latch circuit 1C includes a voltage detector 11, a photovoltaic element 12, a feedback resistor 13, and a diode 18. In the present embodiment, as in the electronic device of FIG. 1, for example, the drive target circuit 200 is driven when a signal level of a drive control signal SC is an "H" level and is stopped when the signal level of the drive control signal SC is an "L" level.

The configuration in which the optical latch circuit 1C shown in FIG. 6 is different from that of the optical latch circuit 1 of the first embodiment is that a diode 18 is newly added.

The diode 18 is connected and inserted in series with the feedback resistor 13 between a determination output terminal OUTPUT and an input terminal INPUT1. Here, the diode 18 is connected in a forward direction from the determination output terminal OUTPUT to the input terminal INPUT1. For example, the diode 18 has an anode connected to the determination output terminal OUTPUT and a cathode connected to one end of the feedback resistor 13. The other end of the feedback resistor 13 is connected to the input terminal INPUT1.

When the input terminal INPUT1 has the "H" level and the determination output terminal OUTPUT has the level, the diode 18 is provided, so that an electric current is prevented from flowing from the input terminal INPUT1 to an output terminal OUT via the feedback resistor 13.

Thereby, when the drive control signal SC output from the determination output terminal OUTPUT is at the "L" level, it is possible to prevent a power generation voltage VI1 output by the photovoltaic element 12 from being reduced and photovoltaic power of the photovoltaic element 12 can increase at least the voltage of the input terminal INPUT1.

Because the operation of the voltage detector 11 when the "H" level drive control signal SC is applied to the input terminal INPUT1 is similar to that of the first embodiment, the description thereof will be omitted.

Also, a forward voltage of the diode 18 is increased, so that the electric current flowing through the lead resistor 111 in a latched state can be reduced, i.e., electric current consumption when the drive control signal SC is at the "H" level can be reduced, and power consumption of the battery in a driven state of the drive target circuit 200 can be reduced.

Also, when the drive control signal SC output from the determination output terminal OUTPUT is at the "H" level, the direction is the forward direction, so that an "H" level signal is propagated to the input terminal INPUT' via the diode 18 and the feedback resistor 13 and the drive control signal SC output from the determination output terminal OUTPUT is retained (latched) at the "H" level.

That is, according to the present embodiment, even if an intensity of light radiated to the photovoltaic element 16 exceeds the preset intensity and an intensity of light incident on the photovoltaic element 12 is weak, the drive control signal SC can be changed from the "L" level to the "H" level and the drive control signal SC output from the determination output terminal OUTPUT can be retained (latched) at the "H" level.

Fifth Embodiment

Figure 7:
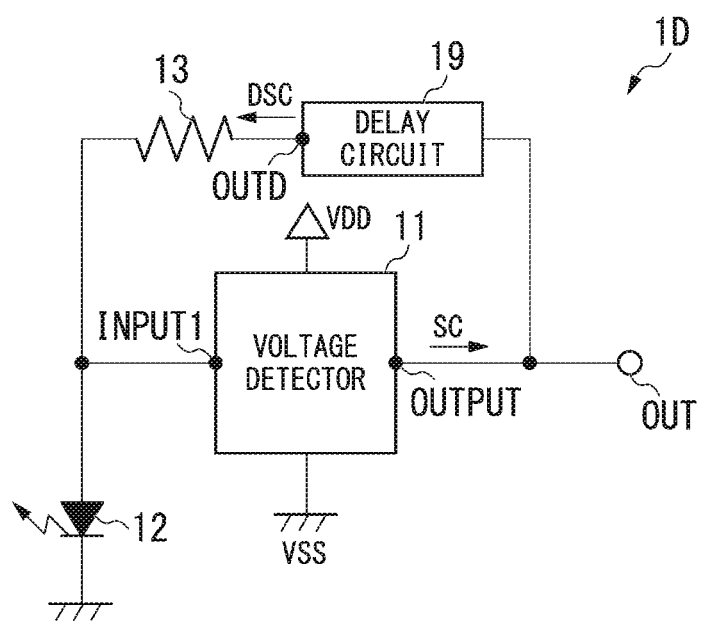
FIG. 7 is a schematic block diagram showing an example of a configuration of an optical latch circuit according to a fifth embodiment of the present invention.

Hereinafter, a fifth embodiment of the present invention will be described with reference to the drawings. FIG. 7 is a schematic block diagram showing an example of a configuration of an optical latch circuit according to the fifth embodiment of the present invention.

In FIG. 6, an optical latch circuit ID includes a voltage detector 11, a photovoltaic element 12, a feedback resistor 13, and a delay circuit 18. In the present embodiment, as in the electronic device of FIG. 1, for example, the drive target circuit 200 is driven when a signal level of a drive control signal SC is an "H" level and is stopped when the signal level of the drive control signal SC is an "L" level.

The configuration in which the optical latch circuit 1D shown in FIG. 7 is different from that of the optical latch circuit 1 of the first embodiment is that a delay circuit 19 is newly added.

The delay circuit 19 is connected and inserted in series with the feedback resistor 13 between a determination output terminal OUTPUT and an input terminal INPUT1. Here, for example, the delay circuit 19 has one end connected to the determination output terminal OUTPUT and the other end connected to one end of the feedback resistor 13. The other end of the feedback resistor 13 is connected to the input terminal INPUT1.

When light having an intensity exceeding a preset intensity is radiated, the photovoltaic element 12 outputs a power generation voltage VI1 exceeding a threshold voltage VTH1.

When the power generation voltage VI1 exceeds the threshold voltage VTH1, the voltage detector 11 causes a drive control signal SC output from the determination output terminal OUTPUT to be changed from the "L" level to the "H" level.

At this time, when the photovoltaic element 12 is not irradiated with light exceeding the preset intensity beyond the delay time of the delay circuit 19, the delay circuit 19 maintains a delay signal DSC output from the output terminal OUTD at the "L" level even if the drive control signal SC is at the "H" level via the feedback resistor 13 and does not cause the change from the "L" level to the "H" level of the drive control signal SC to be propagated to the input terminal INPUT1.

On the other hand, when the photovoltaic element 12 is irradiated with light exceeding the preset intensity beyond the delay time of the delay circuit 19, the delay circuit 19 causes the change from the "L" level to the "H" level of the drive control signal SC to be propagated as the "H" level delay signal DSC to the input terminal INPUT1 via the feedback resistor 13.

Because the operation of the voltage detector 11 when the "H" level drive control signal SC is applied to the input terminal INPUT1 is similar to that of the first embodiment, the description thereof will be omitted.

Figure 8:
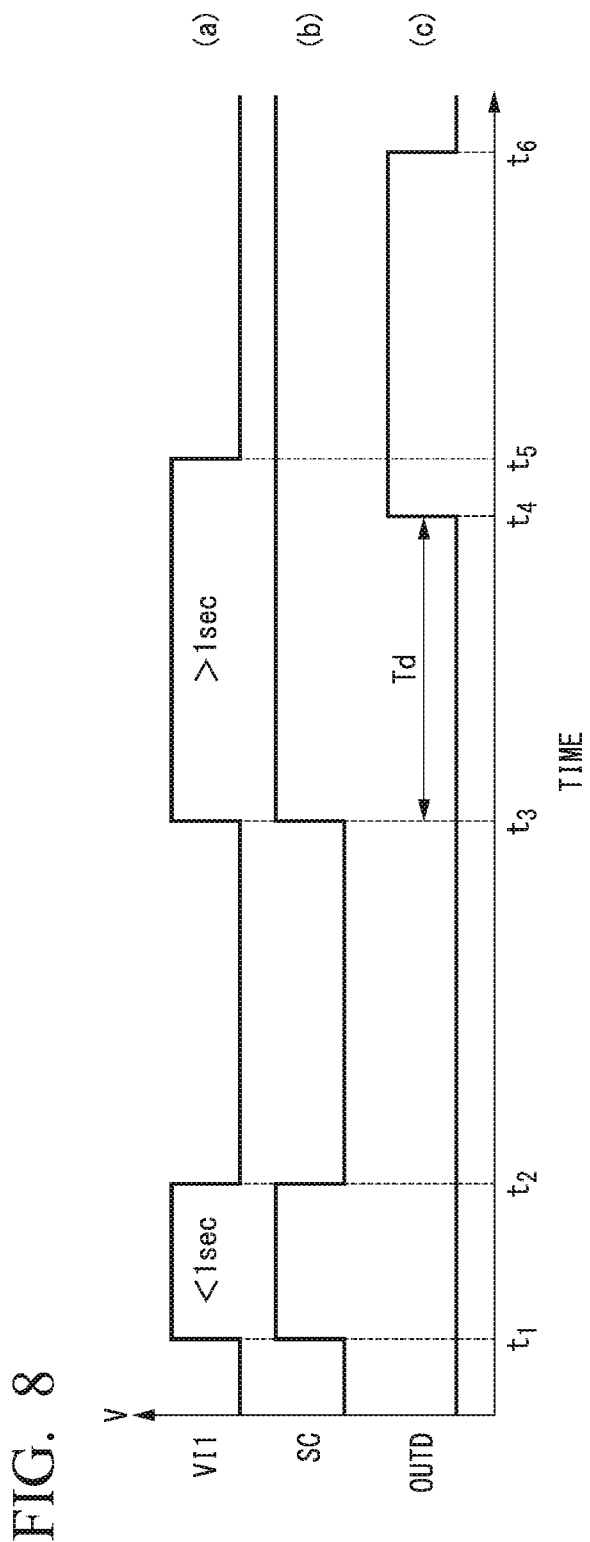
FIG. 8 is a timing chart showing an operation in which a delay circuit 19 delays the propagation of a drive control signal SC in an optical latch circuit 1D.

FIG. 8 is a timing chart showing an operation in which the delay circuit 19 delays the propagation of the drive control signal SC in the optical latch circuit 1D. In the following description, a delay time Td from the input of a signal of the delay circuit 19 to the output of a signal is set to 1 second (sec).

In FIG. 8(a), the vertical axis represents a voltage value of the power generation voltage VI1 output by the photovoltaic element 12 and the horizontal axis represents time.

Figure 9:
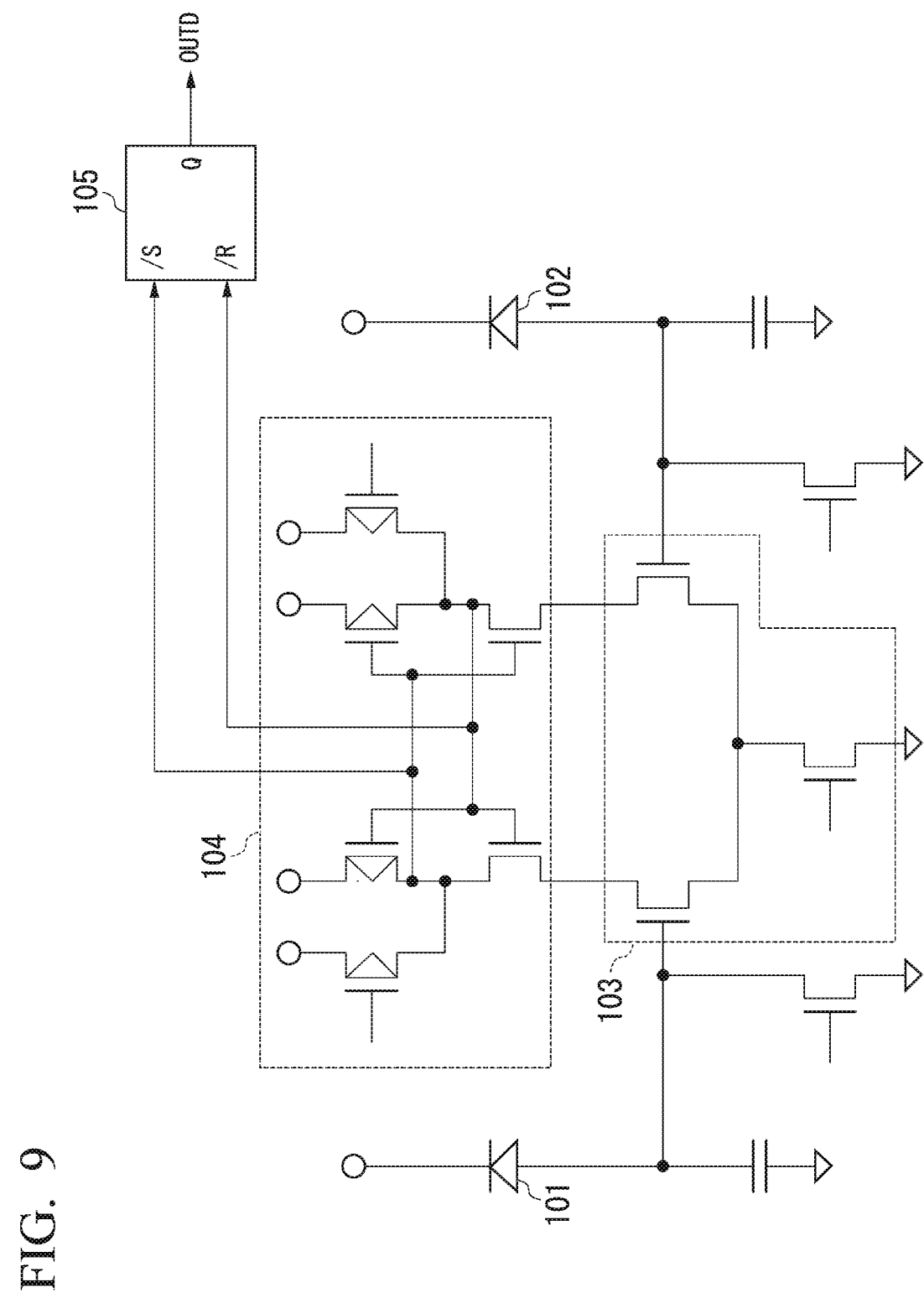
FIG. 9 is a diagram showing a conventional example of an optical latch circuit that supplies electric power from a battery to an electronic device when light is radiated.

In FIG. 9(b), the vertical axis represents a voltage level of the drive control signal SC output from the determination output terminal OUTPUT of the voltage detector 11, and the horizontal axis represents time.

In FIG. 9(c), the vertical axis represents a voltage level of the delay signal DSC output from the output terminal OUTD of the delay circuit 19 and the horizontal axis represents time.

At a time t1, the photovoltaic element 12 is irradiated with light exceeding a preset intensity.

Thereby, the photovoltaic element 12 generates the power generation voltage VI1 that exceeds a threshold voltage VTH1.

The power generation voltage VI1 is supplied to the input terminal INPUT1 and the voltage detector 11 causes a voltage level of the drive control signal SC output from the determination output terminal OUTPUT to be changed from the "L" level to the "H" level.

At this time, because the delay time Td has not elapsed, the delay circuit 19 maintains the voltage level of the delay signal DSC output from the output terminal OUTD at the "L" level.

Also, the optical latch circuit 1D causes the voltage level of the drive control signal SC output from an output terminal OUT to be changed from the "L" level to the "H" level.

At a time t2, the photovoltaic element 12 is not irradiated with light exceeding a preset intensity.

Thereby, the photovoltaic element 12 generates a power generation voltage VI1 lower than or equal to the threshold voltage VTH1. The power generation voltage VI1 is supplied to the input terminal INPUT1 and the voltage detector 11 causes the voltage level of the drive control signal SC output from the determination output terminal OUTPUT to be changed from the "H" level to the "L" level.

At this time, because the voltage level of the drive control signal SC has changed from the "H" level to the "L" level without the delay time Td elapsing in the delay circuit 19, the voltage level of the delay signal DSC output from the output terminal OUTD is maintained at the "U" level.

Also, the optical latch circuit 1D causes the voltage level of the drive control signal SC output from the output terminal OUT to be changed from the "H" level to the "L" level.

At a time t3, the photovoltaic element 12 is irradiated with light having an intensity exceeding a preset intensity, as in the case of the time t1.

Thereby, the photovoltaic element 12 generates a power generation voltage VI1 that exceeds the threshold voltage MIL The above-described power generation voltage VI1 is supplied to the input terminal INPUT1 and the voltage detector 11 causes the voltage level of the drive control signal SC output from the determination output terminal OUTPUT to be changed from the "L" level to the "H".

At this time, because the delay time Td has not elapsed, the delay circuit 19 maintains the voltage level of the delay signal DSC output from the output terminal OUTD at the "L" level of the drive control signal SC.

At a time t4, the elapsed time from the time t3 when the radiation of light exceeding the preset intensity to the photovoltaic element 12 is started exceeds the delay time Td of the delay circuit 19.

At this time, because the power generation voltage VI1 exceeding the threshold voltage VTH1 is supplied to the input terminal INPUT1, the voltage detector 11 maintains the voltage level of the drive control signal SC output from the determination output terminal OUTPUT at the "H" level.

Thereby, the delay circuit 19 causes the voltage level of the delay signal DSC output from the output terminal OUTD to be changed from the "L" level to the "H" level because the delay time Td has elapsed.

At a time t5, the photovoltaic element 12 is not irradiated with light exceeding a preset intensity.

Thereby, the photovoltaic element 12 generates a power generation voltage VI1 lower than or equal to the threshold voltage VTH1. However, in the voltage detector 11, an "H" level delay signal DSC is supplied from the output terminal OUTD of the delay circuit 19 to the input terminal INPUT1 via the feedback resistor 13. Thus, the voltage detector 11 maintains the voltage level of the drive control signal SC output from the determination output terminal OUTPUT at the "H" level.

According to the above processing, the optical latch circuit ID latches the voltage level of the drive control signal SC output from the output terminal OUT at the "H" level even if the power generation voltage VI1 supplied from the photovoltaic element 12 is lower than or equal to the threshold voltage VTH1 and continuously outputs the "H" level drive control signal SC.

As described above, in the present embodiment, when the time for irradiating the photovoltaic element 12 with light exceeding the preset intensity s less than the delay time Td set in the delay circuit 19, it is possible to output the "H" level drive control signal SC from the optical latch circuit 1D only in a time range in which light is radiated, i.e., it is possible to change the level of the drive control signal SC to the "L" level within the range of the delay time Td even if the optical latch circuit ID outputs the "H" level.

With the above configuration, according to the present embodiment, because the operation test is performed within the delay time Td by setting a time period in which the photovoltaic element 12 is irradiated with light exceeding the preset intensity to a time period less than the delay time Td set in the delay circuit 19 and therefore the optical latch circuit 1D does not latch the drive control signal SC at the "H" level when the operation test of the optical latch circuit 1D and the operation test of the drive target circuit 200 are performed in the electronic device shown in FIG. 1, the electronic device can be in a stock or non-operation period after the operation test.

Although embodiments of the present invention have been described above with reference to the drawings, specific configurations are not limited to the embodiments and other designs and the like may also be included without departing from the scope of the present invention.

The invention claimed is:

1. An optical latch circuit, comprising:
a voltage detector configured to compare a first power generation voltage input from a first input terminal with a preset first threshold voltage and start to output a set signal from a determination output terminal when the first power generation voltage exceeds the first threshold voltage;
a first photovoltaic element connected between the first input terminal and a grounding point in a forward direction in a photovoltaic mode and configured to output the first power generation voltage to the first input terminal according to photovoltaic power when light is radiated; and
a feedback resistor inserted between the first input terminal and the determination output terminal,
wherein the voltage detector is configured to only consume a power generated by the first photovoltaic element to start to output the set signal.

2. The optical latch circuit according to claim 1, wherein a resistance value of the feedback resistor is set to a resistance value in which a voltage of the first input terminal exceeds the first threshold voltage when light of an intensity desired to be detected is radiated and an electric current generated from the first photovoltaic element flows through the first input terminal to the voltage detector.

3. The optical latch circuit according to claim 1, further comprising a diode connected in series with the feedback resistor between the determination output terminal and the first input terminal so that the diode is connected in a forward direction from the determination output terminal to the first input terminal.

4. The optical latch circuit according to claim 1, further comprising a delay circuit connected in series with the feedback resistor between the determination output terminal and the first input terminal, and configured to delay propagation of a voltage signal output from the determination output terminal to the first input terminal by a predetermined time period.

5. The optical latch circuit according to claim 1, further comprising a second photovoltaic element connected between a second input terminal of the voltage detector and the ground in a reverse direction,
wherein the voltage detector compares a second power generation voltage of the second photovoltaic element input from the second input terminal with a preset second threshold voltage, and stops an output of the set signal from the determination output terminal when the second power generation voltage exceeds the second threshold voltage.

6. The optical latch circuit according to claim 1, further comprising:
a current mirror circuit; and
a second photovoltaic element connected between an input current terminal of the current mirror circuit and the ground in the forward direction,
wherein an output current terminal of the current mirror circuit is connected to the first input terminal.

7. The optical latch circuit according to claim 1, wherein the voltage detector includes
a first P-channel metal-oxide-semiconductor (PMOS) transistor having a source connected to a power supply;
a second PMOS transistor having a source connected to the power supply, a drain connected to a gate of the first PMOS transistor, and a gate connected to a drain of the first PMOS transistor;
a depletion-type first N-channel metal-oxide-semiconductor (NMOS) transistor having a drain connected to the drain of the first PMOS transistor, a gate which is grounded, and a source connected to the first input terminal;
an enhancement-type second NMOS transistor having a drain connected to the drain of the second PMOS transistor, a gate which is grounded via the first photovoltaic element, and a source which is grounded; and
an inverter having an input terminal connected to the drain of the second PMOS transistor and an output terminal connected to the determination output terminal.

8. An electronic device, comprising:
the optical latch circuit according to claim 1; and
a drive target circuit configured to perform a predetermined process,
wherein driving of the drive target circuit starts when the set signal is supplied from the determination output terminal in the optical latch circuit.

9. The optical latch circuit according to claim 2, further comprising a diode connected in series with the feedback resistor between the determination output terminal and the first input terminal so that the diode is connected in a forward direction from the determination output terminal to the first input terminal.

10. The optical latch circuit according to claim 2, further comprising a delay circuit connected in series with the feedback resistor between the determination output terminal and the first input terminal, and configured to delay propagation of a voltage signal output from the determination output terminal to the first input terminal by a predetermined time period.

11. The optical latch circuit according to claim 3, further comprising a second photovoltaic element connected between the first input terminal and the ground in a reverse direction in parallel to the first photovoltaic element.

12. The optical latch circuit according to claim 4, further comprising a second photovoltaic element connected between the first input terminal and the ground in a reverse direction in parallel to the first photovoltaic element.

13. The optical latch circuit according to claim 2, further comprising a second photovoltaic element connected between a second input terminal of the voltage detector and the ground in a reverse direction,
wherein the voltage detector compares a second power generation voltage of the second photovoltaic element input from the second input terminal with a preset second threshold voltage, and stops an output of the set signal from the determination output terminal when the second power generation voltage exceeds the second threshold voltage.

14. The optical latch circuit according to claim 3, further comprising a second photovoltaic element connected between a second input terminal of the voltage detector and the ground in a reverse direction,
wherein the voltage detector compares a second power generation voltage of the second photovoltaic element input from the second input terminal with a preset second threshold voltage, and stops an output of the set signal from the determination output terminal when the second power generation voltage exceeds the second threshold voltage.

15. The optical latch circuit according to claim 4, further comprising a second photovoltaic element connected between a second input terminal of the voltage detector and the ground in a reverse direction,
    wherein the voltage detector compares a second power generation voltage of the second photovoltaic element input from the second input terminal with a preset second threshold voltage, and stops an output of the set signal from the determination output terminal when the second power generation voltage exceeds the second threshold voltage.

16. The optical latch circuit according to claim 2, further comprising:
    a current mirror circuit; and
    a second photovoltaic element connected between an input current terminal of the current mirror circuit and the ground in the forward direction,
    wherein an output current terminal of the current mirror circuit is connected to the first input terminal.

17. The optical latch circuit according to claim 3, further comprising:
    a current mirror circuit; and
    a second photovoltaic element connected between an input current terminal of the current mirror circuit and the ground in the forward direction,
    wherein an output current terminal of the current mirror circuit is connected to the first input terminal.

18. The optical latch circuit according to claim 4, further comprising:
    a current mirror circuit; and
    a second photovoltaic element connected between an input current terminal of the current mirror circuit and the ground in the forward direction,
    wherein an output current terminal of the current mirror circuit is connected to the first input terminal.

19. An optical latch circuit, comprising:
    a voltage detector configured to compare a first power generation voltage input from a first input terminal with a preset first threshold voltage and output a set signal from a determination output terminal when the first power generation voltage exceeds the first threshold voltage;
    a first photovoltaic element connected between the first input terminal and a grounding point in a forward direction and configured to output the first power generation voltage to the first input terminal according to photovoltaic power when light is radiated;
    a feedback resistor inserted between the first input terminal and the determination output terminal; and
    a second photovoltaic element connected between the first input terminal and the ground in a reverse direction in parallel to the first photovoltaic element.

20. An optical latch circuit, comprising:
    a voltage detector configured to compare a first power generation voltage input from a first input terminal with a preset first threshold voltage and output a set signal from a determination output terminal when the first power generation voltage exceeds the first threshold voltage;
    a first photovoltaic element connected between the first input terminal and a grounding point in a forward direction and configured to output the first power generation voltage to the first input terminal according to photovoltaic power when light is radiated;
    a feedback resistor inserted between the first input terminal and the determination output terminal, wherein a resistance value of the feedback resistor is set to a resistance value in which a voltage of the first input terminal exceeds the first threshold voltage when light of an intensity desired to be detected is radiated and an electric current generated from the first photovoltaic element flows through the first input terminal to the voltage detector; and
    a second photovoltaic element connected between the first input terminal and the ground in a reverse direction in parallel to the first photovoltaic element.

\* \* \* \* \*